United States Patent [19]
Ohkase

[11] Patent Number: 5,763,856
[45] Date of Patent: Jun. 9, 1998

[54] HEAT TREATMENT APPARATUS AND METHOD

[75] Inventor: Wataru Ohkase, Sagamihara, Japan

[73] Assignee: Tokyo Electron Limited, Tokyo, Japan

[21] Appl. No.: 607,189

[22] Filed: Feb. 26, 1996

Related U.S. Application Data

[63] Continuation of Ser. No. 288,006, Aug. 10, 1994, abandoned.

[30] Foreign Application Priority Data

| Aug. 11, 1993 | [JP] | Japan | 5-219050 |
| Aug. 24, 1993 | [JP] | Japan | 5-231009 |
| Aug. 24, 1993 | [JP] | Japan | 5-231010 |
| Dec. 28, 1993 | [JP] | Japan | 5-351398 |

[51] Int. Cl.⁶ ............... C23C 16/00; H05B 3/46; H05B 3/62; F27B 5/14
[52] U.S. Cl. ............... 219/390; 392/416; 118/725
[58] Field of Search .............. 219/390, 405, 219/411; 392/416, 418; 118/725, 729; 432/152

[56] References Cited

U.S. PATENT DOCUMENTS

| 4,486,461 | 12/1984 | Ito et al. | 427/572 |
| 4,857,689 | 8/1989 | Lee | 219/650 |
| 4,958,061 | 9/1990 | Wakabayashi et al. | 219/411 |
| 4,981,815 | 1/1991 | Kakoschke | 437/173 |
| 5,001,327 | 3/1991 | Hirasawa et al. | 219/390 |
| 5,148,714 | 9/1992 | McDiarmid | 74/89.15 |
| 5,156,820 | 10/1992 | Wong et al. | 422/186.05 |
| 5,259,883 | 11/1993 | Yamabe et al. | 118/725 |
| 5,429,498 | 7/1995 | Okase et al. | 432/152 |

FOREIGN PATENT DOCUMENTS

| 5-121341 | 5/1993 | Japan | 392/416 |

Primary Examiner—Teresa J. Walberg
Assistant Examiner—J. Pelham
Attorney, Agent, or Firm—Oblon, Spivak, McClelland, Maier & Neustadt, P.C.

[57] ABSTRACT

A heat treatment apparatus comprising heat rays radiating means having a sheet-like heat rays radiating section, a process tube radiated and heated by heat rays shot from the sheet-like heat rays radiating section, and means for carrying a substrate, which has a surface of a semiconductor film and/or a dielectric film to be treated, into and out of the process tube, wherein said substrate is positioned to the sheet-like heat rays radiating section in the process tube in such a way that the incident angle of heat rays onto the peripheral portion of the treated surface of said substrate becomes smaller than 60°, so that heat rays absorptivity at the peripheral portion of said surface can be increased.

4 Claims, 14 Drawing Sheets

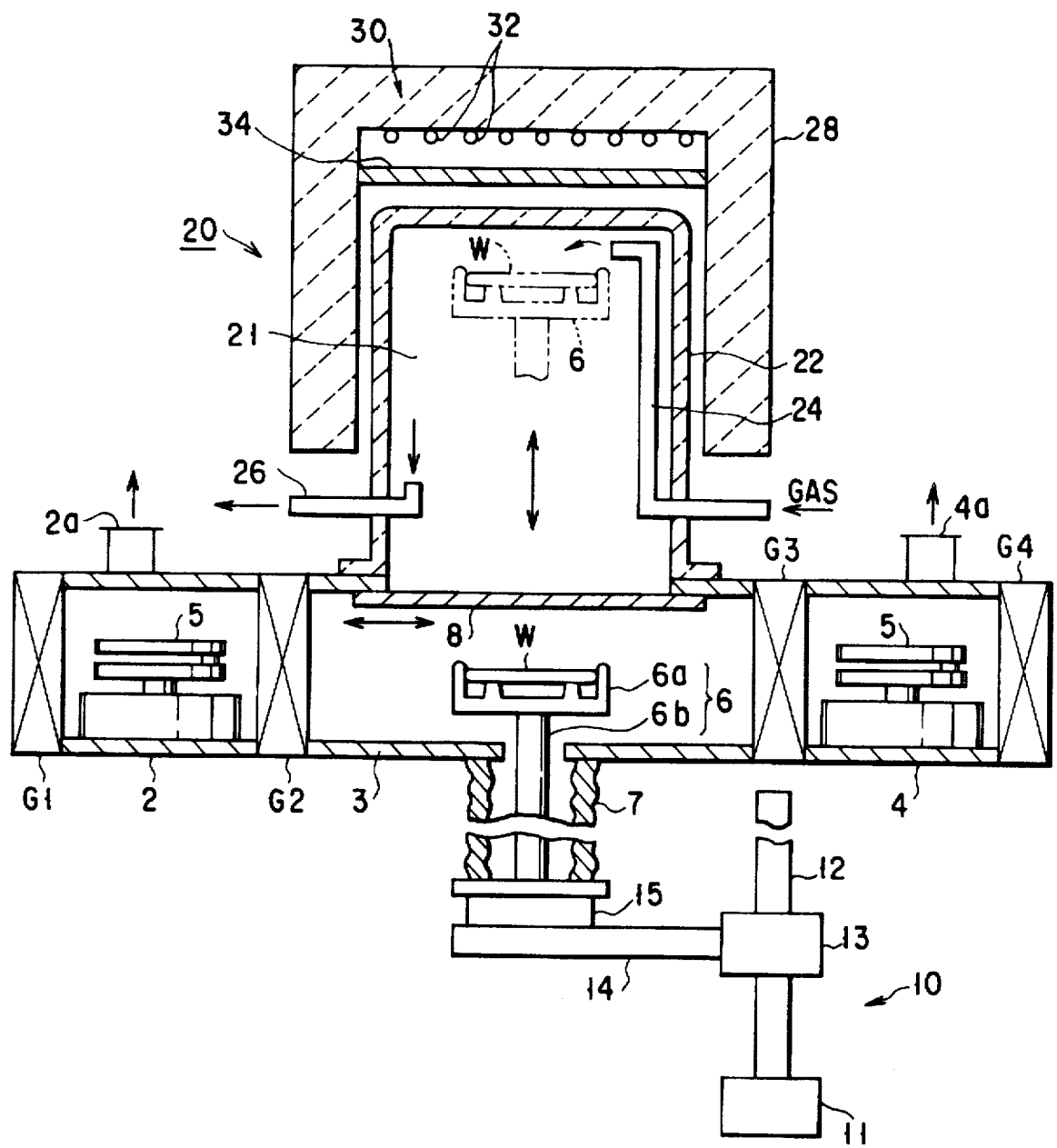
F I G. 1

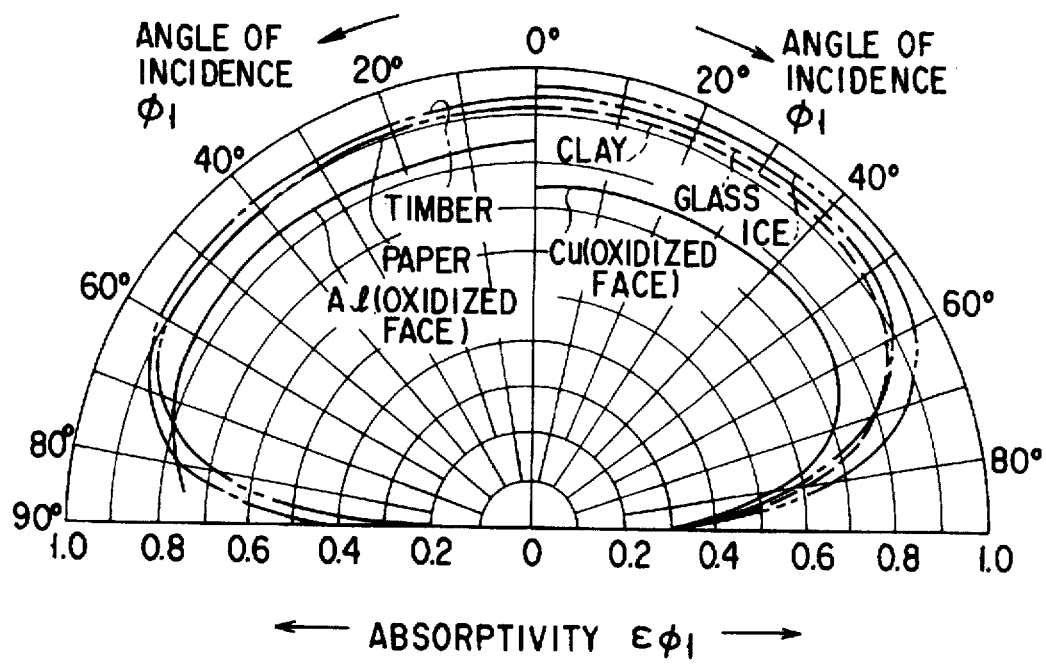
F I G. 4
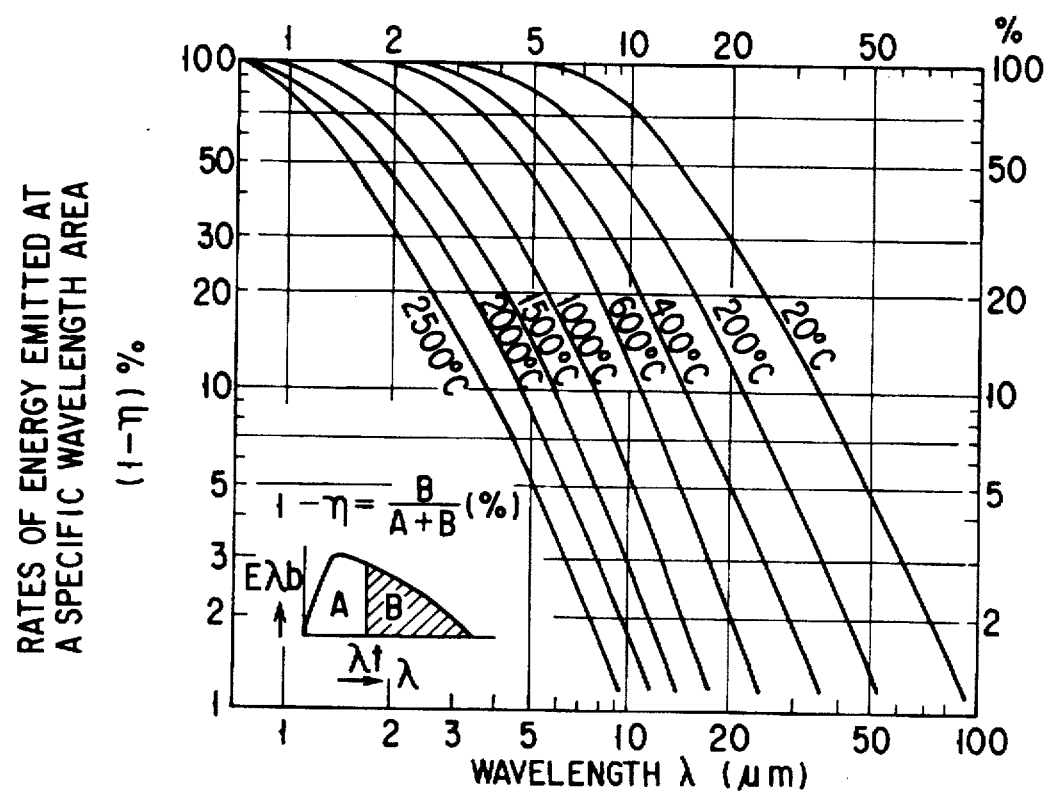
F I G. 5

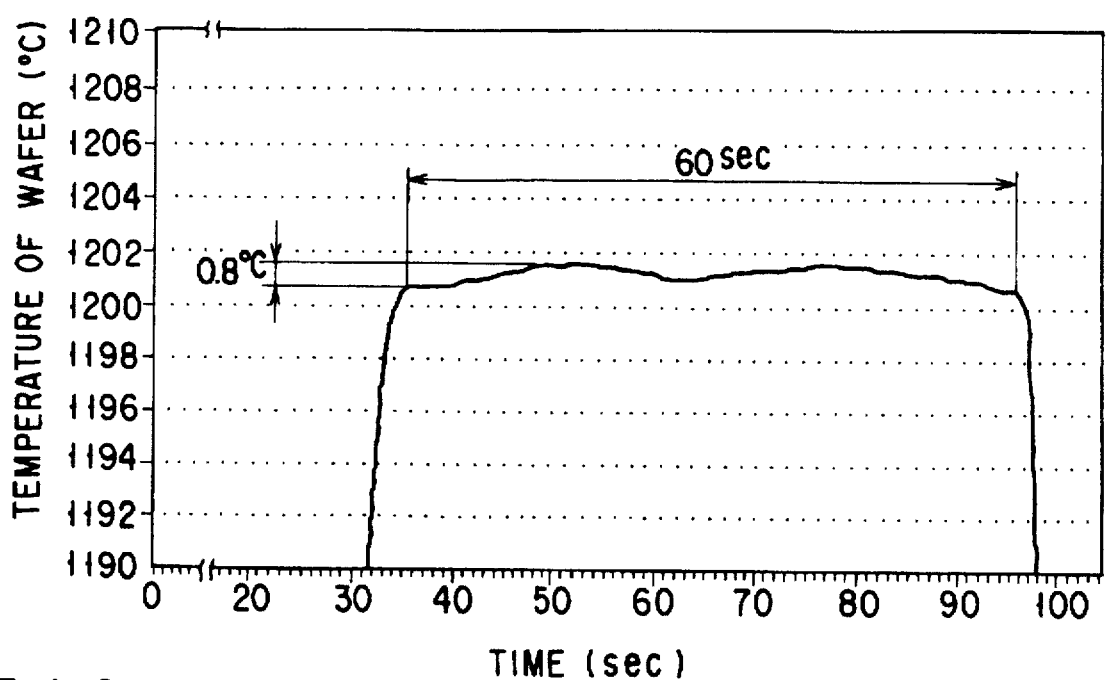
F I G. 11
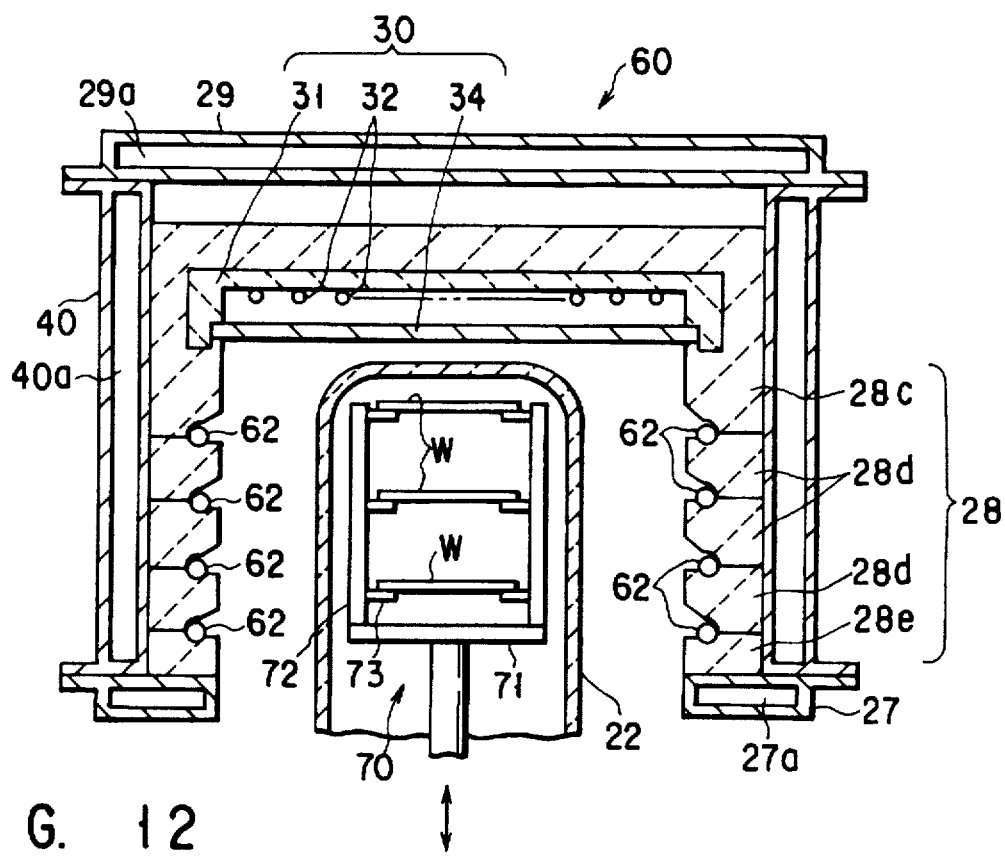
F I G. 12

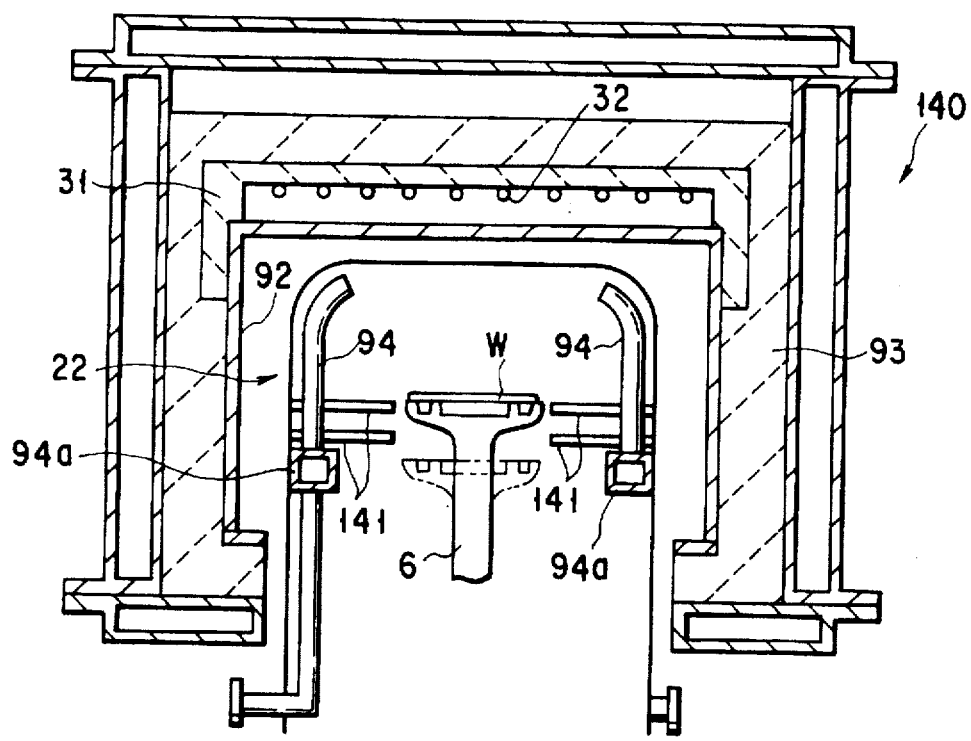
F I G. 31
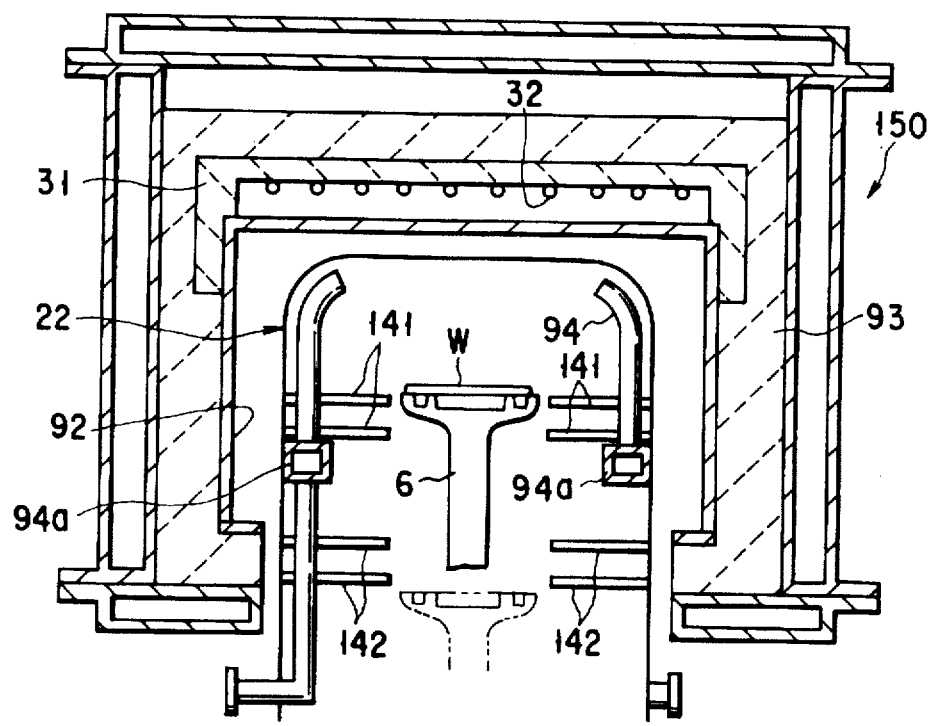
F I G. 32

HEAT TREATMENT APPARATUS AND METHOD

This application is a Continuation of application Ser. No. 08/288,006, filed on Aug. 10, 1994, now abandoned.

BACKGROUND OF THE INVENTION

1. Field of the Invention

The present invention relates to an apparatus and method for heat-treating a substrate and more particularly, an apparatus and a method for more efficiently heating the substrate in a process tube of the vertical type.

2. Description of the Related Art

Various kinds of heat treatment apparatus are used in the course of making semiconductor devices and LCDs to apply oxidation (800°–1100° C.), diffusion (800°–1050° C.), annealing (900°–1200° C. for high temperature annealing and 350°–600° C. for low temperature annealing) and CVD (lower than 850° C.) treatments to substrates. These heat treatment apparatuses are asked to have a higher accuracy in their processes, a higher temperature uniformity in the plane of the substrate and a higher efficiency in their treatments.

Recently, the wafer is made larger and larger in size, from 8-inch to 12-inch. In addition, a heat treatment apparatus is needed to more uniformly and efficiently treat large-sized substrates such as LCD ones. When the substrates are made larger in size, the accuracy of heat treatment, the temperature uniformity in the plane of the substrate, and the heat treatment efficiency must be enhanced to a still further extent.

As the substrates are made larger in size, it is also needed to more effectively prevent the substrate from being slipped and distorted and to make the temperature uniformity in the plane of the substrate higher. It becomes important, therefore, how uniformly heat can be added to the substrate, how difference between temperatures at the center portion and at the peripheral portion of the substrate can be made small, and how film quality or thickness in the plane of the substrate can be made uniform.

SUMMARY OF THE INVENTION

The object of the present invention is therefore to provide heat treatment apparatus and method capable of more efficiently raising the temperature of a substrate while keeping film uniformity in the plane of the substrate.

According to an aspect of the present invention, there can be provided a heat treatment apparatus comprising heat rays radiating means having a sheet-like heat rays radiating section; a process tube radiated and heated by heat rays shot from the sheet-like heat rays radiating section; and means for carrying a substrate, which has a semiconductor film and/or dielectric (or insulating) film face to be treated, into and out of the process tube; wherein the substrate is positioned to the sheet-like heat rays radiating section in the process tube in such a way that the incident angle of heat rays onto the peripheral portion of the treated face of the substrate becomes smaller than 60°, so that heat rays absorptivity at the peripheral portion of the face can be increased.

It is desirable in this case that the following inequality (1) can be established, providing that the diameter of that heat rays radiating area of the heat rays radiating section which is opposed to the treated face of the substrate is denoted by B, the diameter of the treated face by D and the interval of the heat rays radiating area relative to the treated face by h.

$$h \geq 0.578 \times (B-D)/2 \tag{1}$$

When heat rays absorptivity at the peripheral portion of the treated face is increased, radiation loss at the peripheral portion thereof can be compensated and no temperature difference in the plane thereof can be caused. Film quality or uniformity in the plane thereof can be thus achieved. In short, the heat rays absorptivity in the treated face becomes maximum when the incident angle $\phi_1$ of heat rays onto the treated face is 0°, and it becomes smaller as the incident angle $\phi_1$ becomes larger. In a case where the treated face is dielectric (or insulating) film or some kind of semiconductor film, therefore, the incident angle $\phi_1$ of heat rays is set smaller than 60° and temperature distribution in the plane of the treated face is made uniform while keeping temperature raising speed certain.

According to another aspect of the present invention, there can be provided a heat treatment apparatus comprising heat rays radiating means having a sheet-like heat rays radiating section; a process tube radiated and heated by heat rays shot from the sheet-like heat rays radiating section; and means for carrying a substrate, which has conductive film as a face to be treated, into and out of the process tube; wherein the substrate is position to the sheet-like heat rays radiating section in the process tube in such a way that the incident angle of heat rays onto the peripheral portion of the treated face is made larger than 40°, so that reflection loss at the peripheral portion of the treated face can be reduced.

It is desirable in this case that the following inequality (2) can be established, providing that the diameter of that heat rays radiating area which is opposed to the treated face of the substrate is represented by A, the diameter of the treated face by D and the interval of the heat rays radiating area relative to the treated face by h.

$$h \leq 1.2 \times (A-D)/2 \tag{2}$$

In the case where the treated face is conductive film or some kind of semiconductor film, the incident angle $\phi_2$ of heat rays onto the peripheral portion of the treated face is set larger than 40° to reduce reflection loss at the peripheral portion of the treated face. When the incident angle $\phi_2$ is zero degree, energy radiated by reflection becomes large in amount. As the result, heat quantity absorbed by the treated face is small.

According to Stefan-Boltzman's rule, radiant emittance Eb from a black body is proportional to the fourth power of surface temperature T of the black body. This leads to that the product (Eb×A) becomes the total amount of energy emitted from the black body. On the other hand, the amount of energy absorbed from the black body by the substrate is inversely proportional to the square (second power) of the interval L between the black body and the substrate. Therefore, the amount of energy absorbed by the substrate depends deeply on the surface temperature T of the black body but by far less on the interval L between them.

Further, the present invention can be applied to both of systems for directly and indirectly heating the process tube. In the indirect heating system, primary heat rays are radiated from a heating source (such as the resistant heater, for example) to a uniformly-heating member and secondary heat rays (having a wavelength larger than 1.2 μm) are then radiated on the process tube through the uniformly-heating member. The temperature of the substrate is thus raised. Quartz can absorb heat rays having a wavelength of 2.73 μm best. In the direct heating system, primary heat rays (having a wavelength larger than 0.9 μm) are radiated from the heating source (such as the lamp, for example) to the transparent process tube to thereby raise the temperature of the substrate. To add more, transparent quartz has a heat rays transmission of 30–60%.

When the object to be treated is a dielectric (or semiconductor), its heat rays absorptivity becomes higher as the wavelength of heat rays becomes longer, but it becomes lower as temperature becomes higher. When the incident angle of heat rays onto the treated object is smaller than 60°, heat rays absorptivity is kept about certain.

When the object to be treated is a conductor, heat rays absorptivity becomes smaller as the wavelength becomes longer, but it becomes larger as temperature rises higher. When the incident angle of heat rays onto the treated object is larger than 40°, heat rays absorptivity becomes high.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a view showing the whole of the heat treatment apparatus according to a first embodiment of the present invention;

FIG. 4 is a characteristic view showing the relation between the incident angle of heat rays onto treated matters (such as insulating film and glass) and the heat rays absorptivity of the matter;

FIG. 5 is a characteristic view showing rates (%) of energy emitted every temperature at a specific wavelength area;

FIG. 11 shows a temperature history obtained when conductive film is heated to about 1200° C.;

FIG. 12 is a vertically-sectioned view showing the main portion of the heat treatment apparatus according to a third embodiment of the present invention;

FIG. 31 is a vertically-sectioned view showing the main portion of the heat treatment apparatus according to an eighth embodiment of the present invention; and FIG. 32 is a vertically-sectioned view showing the main portion of the heat treatment apparatus according to a ninth embodiment of the present invention.

DETAILED DESCRIPTION OF THE PREFERRED EMBODIMENTS

Some embodiments of the present invention will be described with reference to the accompanying drawings.

Figure 2:
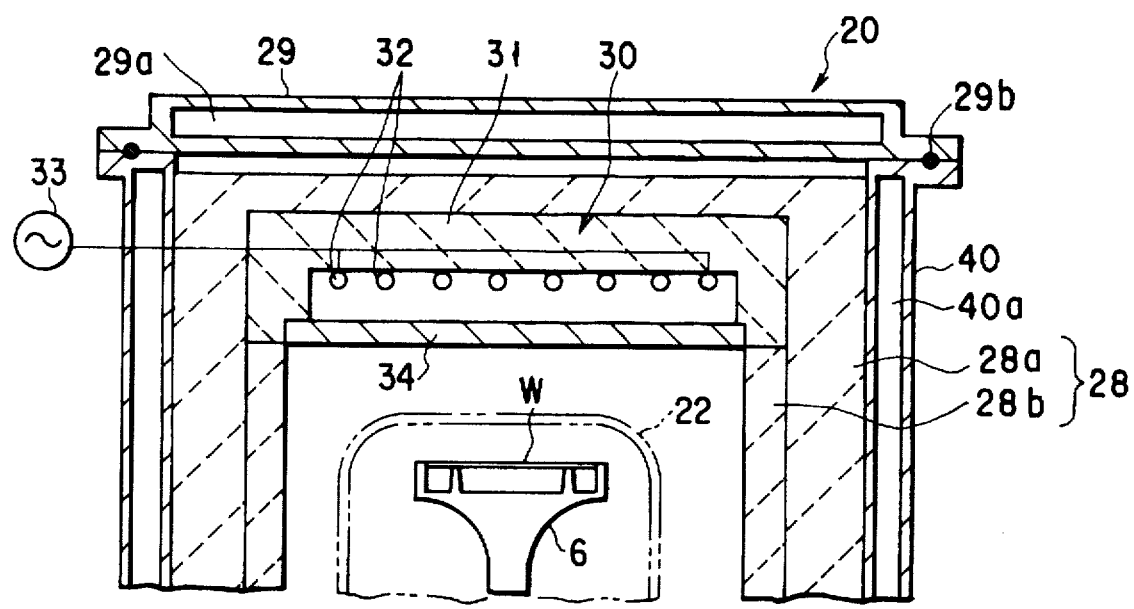
FIG. 2 is a sectional view showing the main portion of the heat treatment apparatus.

As shown in FIG. 1, a heat treatment apparatus has a heat treatment section 20, a load/unload chamber 3, and two load lock chambers 2 and 4. A heater block 28 of the heat treatment section 20 encloses the upper half of a process tube 22. A heater means 30 of the heater block 28 is arranged adjacent to the top of the process tube 22. As shown in FIG. 2, a heater element 32 of the heater means 30 is attached to the inner face of an inner block 31, having a same pitch interval between its corresponding adjacent portions. The heater element 32 is a heating resistance wire and it is connected to a power source 33, which is controlled by a controller (not shown) backed up by a computer system.

The load/unload chamber 3 is connected to the bottom of the process tube 22 in the heat treatment section 20 and when a shutter 8 is opened, it is communicated with the process tube 22. An elevator 6 is arranged in it. A shaft 6b of the elevator 6 is connected to a cylinder mechanism 15, passing through an opening in the bottom of the load/unload chamber 3. The lower portion of the shaft 6b is protected by a flexible sleeve 7 which extends from the underside of the load/unload chamber 3 to the top of the cylinder mechanism 15. The cylinder mechanism 15 is supported by an arm 14 of a lifter mechanism 10. A ball nut 13 is attached to the base end of the arm 14 and it is screwed onto a screw 12, which is rotated by a motor 11.

The first and second load lock chamber 2 and 4 are connected to the load/unload chamber 3 through gate valves G2 and G3, respectively. They are exhausted through passages 2a and 4a, respectively. A wafer carrier unit 5 is arranged in each of them. A gate valve G1 is attached to the front side of the first load lock chamber 2 and when it is opened, the first load lock chamber 2 is communicated with a clean room. A gate valve G4 is attached to the front side of the second load lock chamber 4 and when it is opened, the chamber 4 is communicated with the clean room.

The process tube 22 is made of high purity quartz which is excellent in heat insulation and which is less contaminated by metal. Gas supply pipe 24 and exhaust pipe 26 are introduced into the process tube 22. Process gas is supplied into it through the gas supply pipe 24 and it is exhausted through the gas exhaust pipe 26.

As shown in FIG. 2, a cover 29 is attached to the top of the heat treatment section 20. It is fixed to an outer housing 40 along its outer rim through an O-ring 29b. The outer housing 40 and the cover 29 are made of stainless steel or aluminum alloy and they have inner passages 29a and 40a therein into which coolant such as water is supplied from a coolant supply source (not shown).

The heater block 28 made of heat insulating material such as alumina ceramics is arranged inside the outer housing 40. The heating sheet element 32 of the heater means 30 is fixed to the inner face of the heater block 28. It may be arranged that refractory material (not shown) is attached to the inner face of the heat insulator 31 and that the heating sheet element (or sheet-like heater) 32 is then fixed to this refractory material. The heating sheet element 32 is an element made of $MoSi_2$ or Fe-Cr-Al alloy (Kanthal) and arranged like a sheet.

A uniformly-heating member (or sheet-like heat rays radiating member) 34 is arranged between the process tube 22 and the heating sheet element 32. It serves to receive heat rays shot from the heating sheet element 32 and uniformly radiate secondary heat ray of them to a wafer W in the process tube 22. It is made of SiC, for example, which comparatively less produces foreign matters and which is excellent in heat resistance. As compared with the wafer W, it is made so larger enough in size as to fully cover the peripheral portion of the wafer W. It is arranged above the wafer W. Graphite whose surface is coated with SiC may be used instead of SiC.

The shape and size of the heating sheet element 32 and the uniformly-heating member 34 will be set, considering the following conditions.

When an object 19 to be treated is semiconductor film such as polysilicon or dielectric film such as $SiO_2$, for example, heat rays absorptivity $\epsilon\phi_1$ attained by the wafer W becomes larger as incident angle $\phi_1$ of heat rays becomes smaller. In a case where the objects 19 are an oxidized surface of aluminum, an oxidized surface of copper, glass, ice, clay, wood and paper, as shown in FIG. 4, heat rays absorptivities $\epsilon\phi_1$ at their surfaces decrease gradually when the incident angle $\phi_1$ becomes larger than 60°. In the case of this first embodiment. Therefore, the shape and size of the uniformly-heating member 34 are set to meet the above-mentioned inequality (1). In short, when heat-radiated surface diameter B is set following the space, for example, in which the heat treatment apparatus is installed, level difference (h) is determined on the basis of the value of heat-radiated surface diameter B. Particularly when the uniformly-heating member 34 is made larger in size than the wafer W, the periphery of the wafer W can be radiated by heat rays shot through the peripheral portion of the uniformly-heating member 34.

Referring to FIGS. 3 through 7, it will be described how the first heat treatment apparatus works relative to the wafer W.

Figure 3:
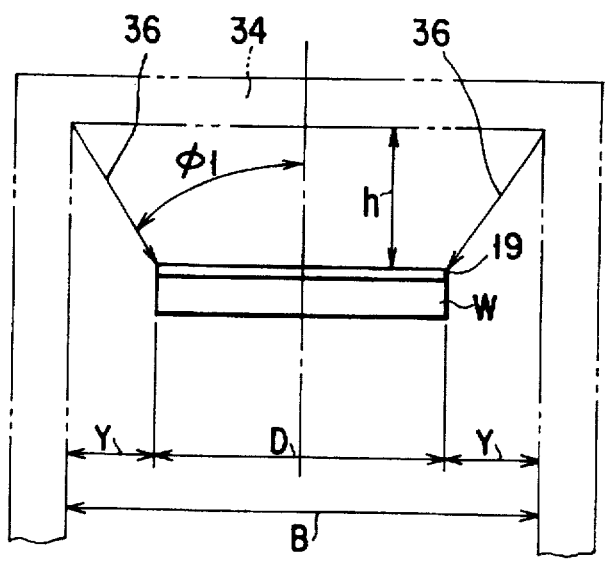
FIG. 3 is a view intended to explain parameters needed to obtain the shape and size of a heating source to achieve a desirable heat rays absorptivity.

In this embodiment, the incident angle $\phi_1$ of heat rays 36 onto the peripheral portion of the wafer W is set smaller than 60°, as shown in FIG. 3. As apparent from FIG. 4, heat rays absorptivities attained by the objects 19 are increased. Parameters h, D, Y and B are obtained, using the formula (1), and the shape and size of the uniformly-heating member 34 are determined to attain a desirable heat rays absorptivity.

FIG. 5 in which wavelengths λ (μm) are plotted on the horizontal axis while radiated energy rates (1–η) in a specific wavelength area on the vertical axis is a characteristic view showing the relation of λ and (1–η) when the temperature T of the heat rays radiating member changes variously in a range of 20° C.–2500° C. As shown by an illustration in FIG. 5, it is represented by (1–η)% what percentage the energy amount in an area ranging from wavelength $\lambda_1$ to infinity (or hatched area B in the illustration) occupies in total radiation amount (A+B). To add more, radiated energy strengths Eλb that heat rays of wavelength have are plotted on the vertical axis in the illustration. When the radiated energy strength Eλb is integrated relating to all of wavelengths λ radiated, energy amount Eb per a unit area can be obtained.

As apparent from FIG. 5, heat rays of wavelength longer than 10 μm occupies 74% of total radiated energy amount at 20° C., and those of wavelength λ longer than 4 μm occupies 80% of total radiated energy amount at 400° C. and 36% thereof at 1000° C. In short, the rate of short wavelength heat rays increases as temperature rises.

Figure 6:
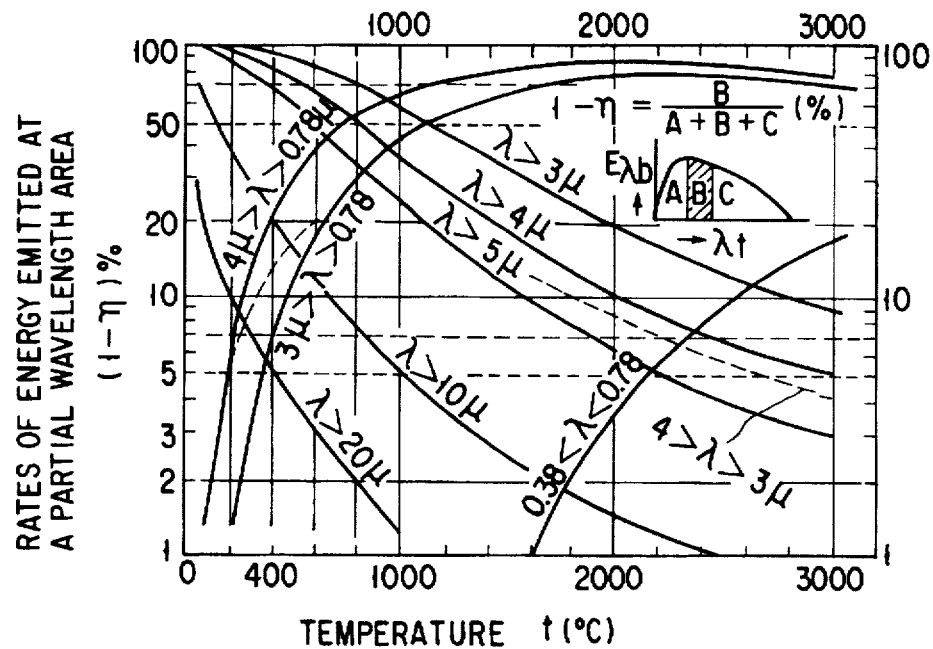
FIG. 6 is a characteristic view showing rates (%) of energy emitted every wavelength at a partial wavelength area.

Plotting temperatures t(°C.) on the horizontal axis while radiated energy rates in a partial wavelength area on the vertical axis, FIG. 6 shows the relation of temperature (t) and (1–η) obtained when a specific partial wavelength area $\lambda_1$–$\lambda_2$ changes variously. This relation is represented by a characteristic curve in every partial wavelength area of visible, near- and far-infrared rays.

Figure 7:
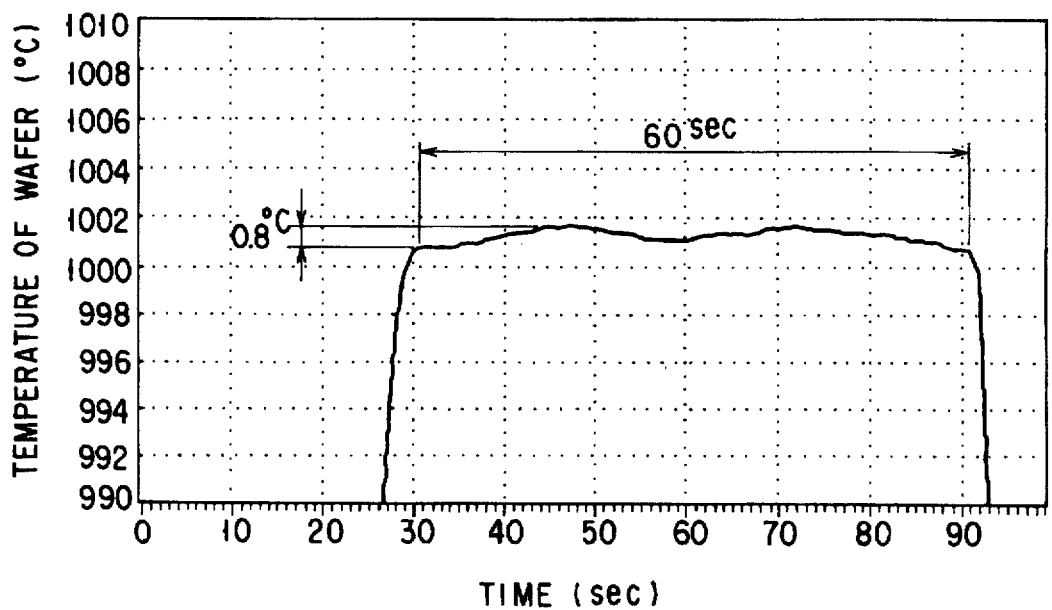
FIG. 7 shows a temperature history obtained when insulating film is heated to about 1000° C.

Plotting lapse time (seconds) on the horizontal axis while wafer temperatures t(°C.) on the vertical axis, FIG. 7 shows a temperature history obtained when the wafer is heated in the heat treatment apparatus. The object 19 to be treated was a gate-oxidized film, which was heated in the oxidizing furnace. The diameter of the wafer W was 8 inches. While moving it up and down, the wafer W was positioned in the process tube 22 in such a way that incident angle $\phi_1$ became smaller than 60°. As apparent from FIG. 7, intended temperature 1000° C. was obtained after the lapse of 30 seconds since the heating of the wafer W was started. Wafer temperature changed only 0.8° C. during the time when it was kept 1000° C. for 60 seconds.

A second embodiment of the present invention will be described with reference to FIGS. 8 through 11.

Figure 8:
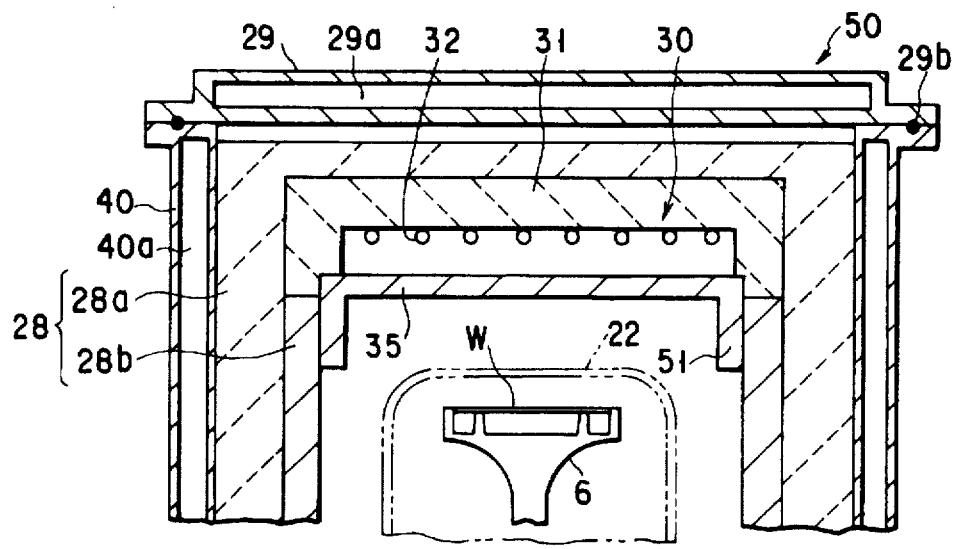
FIG. 8 is a sectional view showing the main portion of the heat treatment apparatus according to a second embodiment of the present invention.

The object 19 to be treated is conductive film in this case and the incident angle $\phi_2$ of heat rays 36 onto the peripheral portion of the wafer W is set larger than a predetermined value to efficiently heat the conductive film. As shown in FIG. 8, a uniformly-heating member 35 is arranged between the heater element 32 and the process tube 22 in a heat treatment section 50. It has a portion 51 which is bent downwards from its rim along the inner heat-resistant block 28b at right angle. This perpendicular bent portion 51 is better as its length becomes larger. The center portion of the member 35 can be made unnecessary. The uniformly-heating member 35 is made of SiC, for example, which comparatively less produces foreign matters and which is excellent in heat resistance. It is arranged above the wafer W and made so larger in size as to fully cover the peripheral portion of the wafer W. Graphite whose surface is coated with SiC may be used instead of SiC.

Figure 9:
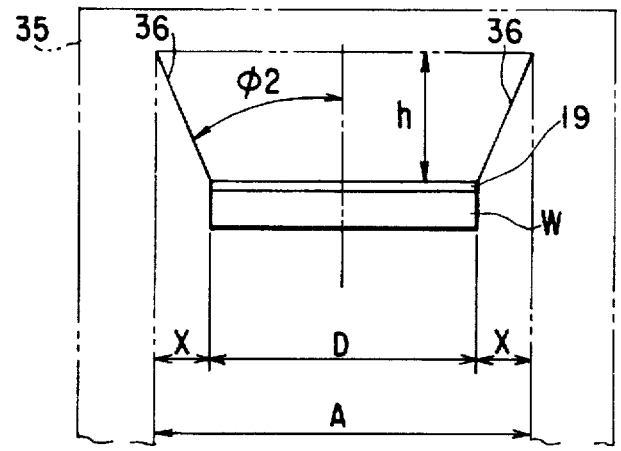
FIG. 9 is a view intended to explain parameters needed to obtain the shape and size of a heating source to achieve a desirable heat rays absorptivity.
Figure 10:
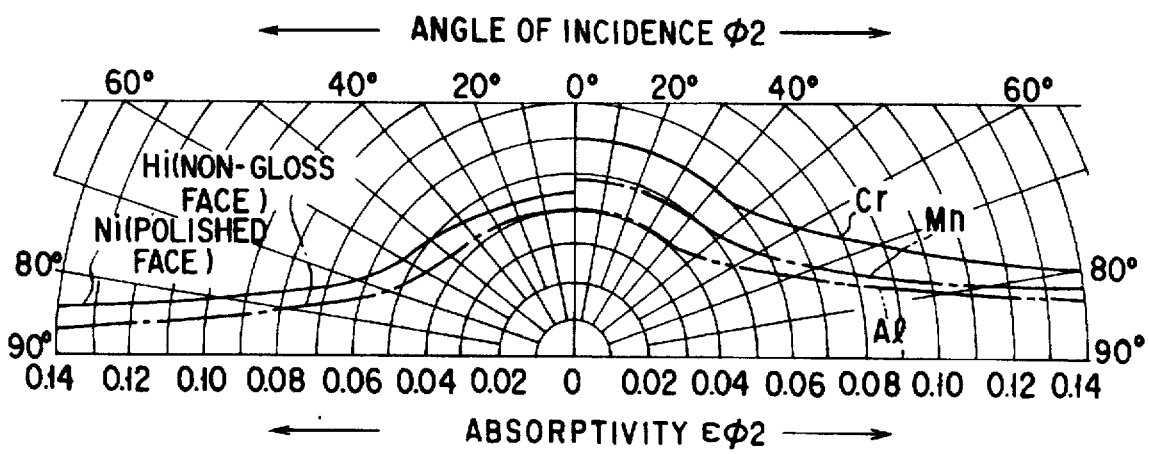
FIG. 10 is a characteristic view showing the relation between the incident angle of heat rays onto a treated matter (such as Ni and Al) and the heat rays absorptivity of the treated matter.

In a case where the object 19 is a non-oxidized surface of metal (or conductor) not oxidized, heat rays absorptivity $\epsilon\phi_2$ obtained by the wafer W increases, as shown in FIG. 10, when incident angle $\phi_2$ becomes larger than 40°. This is because the amount of heat rays reflected becomes large to decrease absorptivity $\epsilon\phi_2$ when incident angle $\phi_2$ becomes smaller than 40°. In this case, therefore, the shape and size of the uniformly-heating member 35 are set to meet the above-mentioned inequality (2). To add more, radiated surface diameter A is larger than wafer diameter D. In short, when the heat-radiated surface diameter A is set depending upon the space, for example, in which the heat treatment apparatus is installed, level difference (h) is determined on the basis of this value A, as shown in FIG. 9.

Plotting lapse time (seconds) on the horizontal axis while wafer temperatures t(°C.) on the vertical axis, FIG. 11 shows a temperature history obtained when the wafer is heated in the heat treatment apparatus. The object 19 to be treated was an ion implantation conductivity film, which was heated in the annealing furnace. The diameter of the wafer W was 8 inches. While moving it up and down, the wafer W was positioned in the process tube 22 in such a way that incident angle $\phi_2$ became larger than 40°. As apparent from FIG. 11, intended temperature 1200° C. was obtained after the lapse of 35 seconds since the heating of the wafer W was started. Wafer temperature changed only 0.8° C. during the time when it was kept 1200° C. for 60 seconds.

The incident angle $\phi$ of heat rays 36 can be changed by moving the matter W nearer to the heating source. In a case where the object 19 to be treated has dielectric film and conductive film, its temperature raising speed can be made higher when its conductive film is made nearer to the heating source. In short, reflected energy increases and the absorptivity of heat rays decreases in the case of conductive film, when the incident angle $\phi$ is small, but the lack of heat quantity can be compensated by positioning the conductive film nearer to the heating source.

According to the present invention as described above, the matter to be treated can be uniformly heated in its plane without causing any loss in its heat rays absorptivity at its peripheral portion. In addition, its temperature raising speed can be made higher when its heat rays absorptivity in its plane, particularly at its peripheral portion is increased.

A third embodiment of the present invention will be described referring to FIGS. 12 through 22.

Although a sheet of wafer W has been treated in the above-described first and second embodiments, three sheets of wafer W are treated in a heat treatment apparatus 60 which will be embodied according to the third embodiment of the present invention. A ring boat 70 is loaded and unloaded into and from the process tube 22. It has an end plate 71, a main post 72 and three ring supports 73. An 8-inch wafer W is horizontally supported on each ring support 73. The interval of each wafer W relative to its adjacent one is ¼–1 times the wafer diameter. Conductive film 19 is formed on each wafer W.

A heater element 62 of the heat resistant type encloses the process tube 22. It is supported by the heat resistant block 28 which comprises ring-shaped heat resistant members 28c–28e. Each of the heat resistant members 28c–28e is made of sintered mullite or corundum alumina, for example. The top heat resistant member 28c supports the top heater means 30 as well. The top heater means 30 is same as the one used in the above-described first embodiment. The middle and bottom heat resistant members 28d and 28e have a same inner diameter and they are piled one upon the other at a predetermined pitch interval. The bottom heat resistant member 28e is supported by a metal-made bottom jacket 27. The bottom jacket 27 has an internal passage 27a through which cooling water flows.

Figure 13:
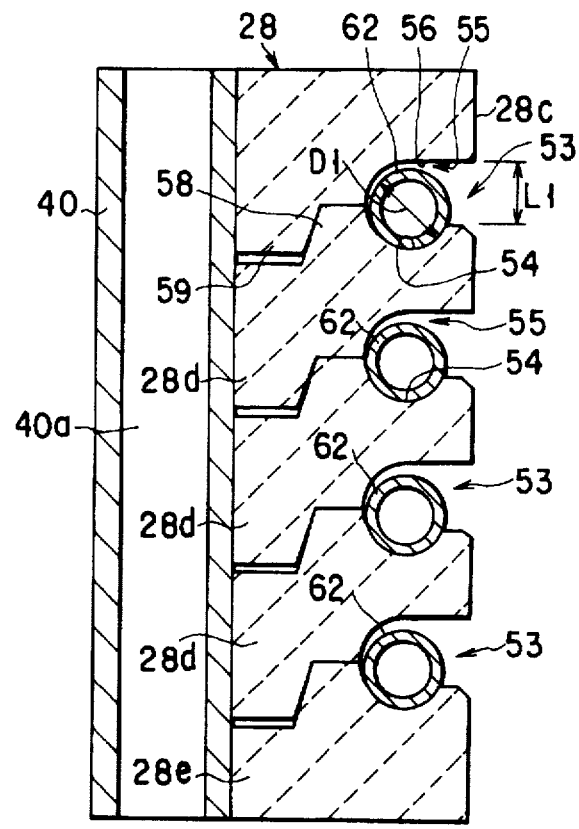
FIG. 13 is a vertically-sectioned view showing a side wall heater unit.

As shown in FIG. 13, the heat resistant members 28c, 28d and 28e are connected to one another by their engaging portions 58 and 59 to form a space 55 between them on their inner sides. Each space 55 has an opening 53 which faces the process tube 22, and when the element 62 is heated, its heat rays are shot to the process tube 22 through the opening 53. It is held in a recess 54 in each space 55 between the heat resistant members. The height $L_1$ of each opening 53 is made a little larger than the diameter $D_1$ of the element 62. The heat resistant members 28c, 28d and 28e are fixed to the outer housing or shell 40 by screws.

Figure 14:
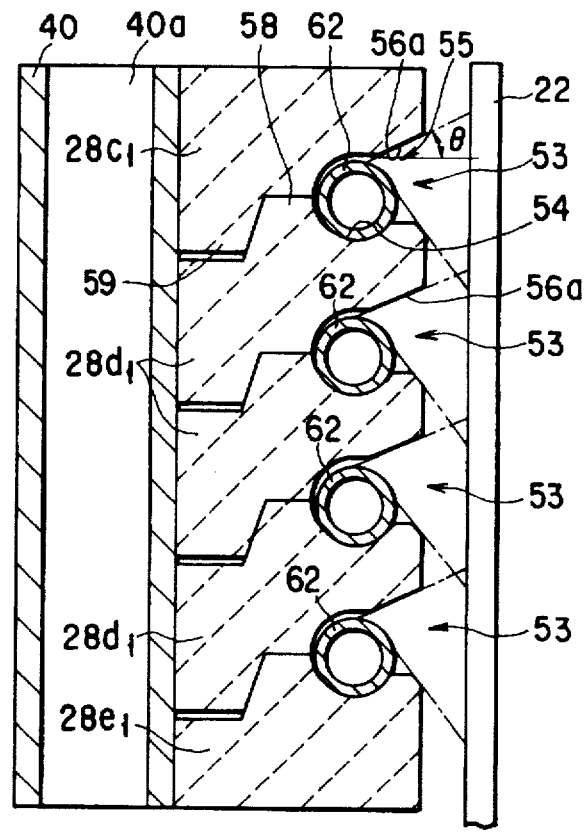
FIG. 14 is a vertically-sectioned view showing another side wall heater unit.

As shown in FIG. 14, parts of heat resistant members $28c_1$ and $28d_1$ are cut away to enlarge the opening 53 of the space 55. When the opening 53 of each space 55 is enlarged in this manner, heat rays 36 can radiate the process tube 22 at a larger area. An angle $\theta$ at which a cut-away face 56a of each heat resistant member is formed relative to the horizontal plane is set to enable heat rays radiated by the element 62 in the adjacent spaces 55 to be overlapped.

To describe briefly, the assembly of the heater block 28 is conducted as follows. The middle members 28d are piled one upon the other on the bottom member 28e. The heater element 62 is seated in their spaces 55 before the top member 28c is mounted on the top of the middle members 28d thus piled. When the top member 28c is mounted in this manner, they are fixed to the outer shell 40. The space 55 is large enough to hold the heater element 62 therein. When the heater element 62 is expanded by heat, therefore, they cannot be damaged. In addition, the heater element 62 can be prevented from coming out of the space because it is seated in the recess 54 in the space 55.

Figure 17:
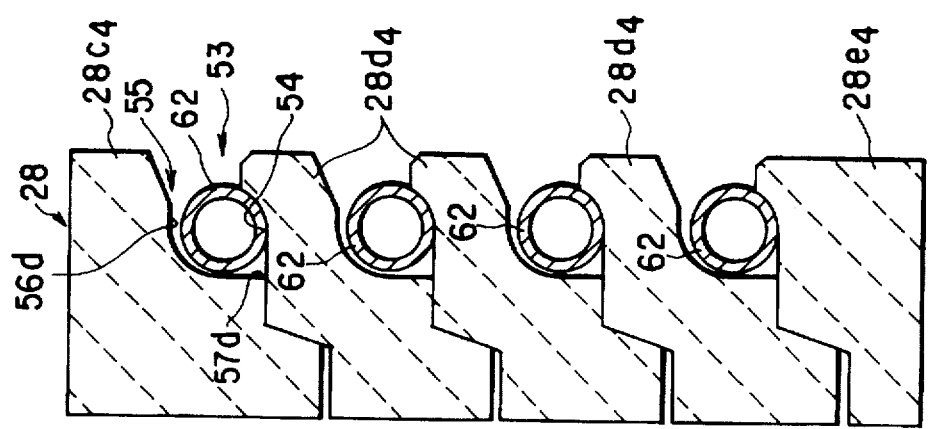
FIG. 17 is a vertically-sectioned view showing a still further side wall heater unit.
Figure 16:
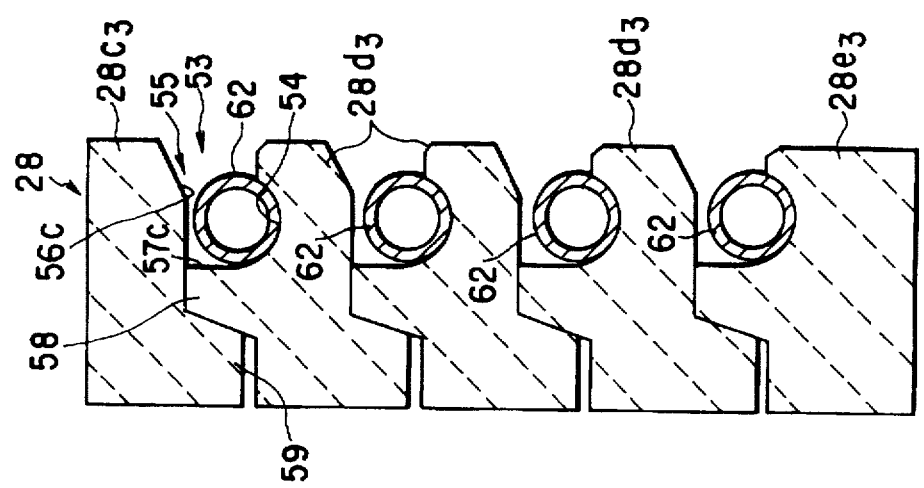
FIG. 16 is a vertically-sectioned view showing a still further side wall heater unit.
Figure 15:
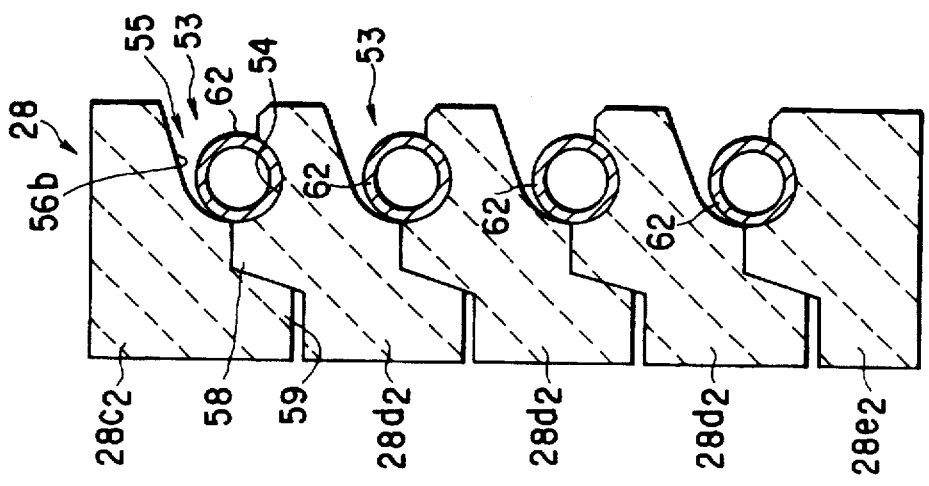
FIG. 15 is a vertically-sectioned view showing a further side wall heater unit.

The space 55 may have a top 56b, as shown in FIG. 15. The shape of this top 56b is a combination of arc and tangential planes. The space 55 may have a top 56c and a side 57c, as shown in FIG. 16. The top 56c is a combination of horizontal and tilted planes. The side 57c is a part of each of the lower members $28d_3$ and $28e_3$ in this case. The space 55 may have a top 56d and a side 57d, as shown in FIG. 17. These top and side 56d and 57d are a combination of the arc and tilted planes. They are a part of each of the upper members $28c_4$ and $28d_4$ in this case.

Figure 18:
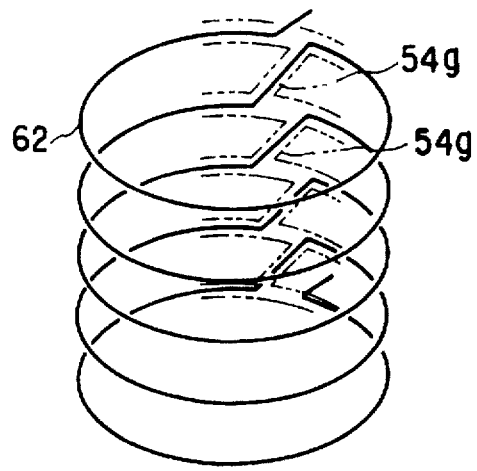
FIG. 18 is a perspective view showing a heater element dismantled.
Figure 19:
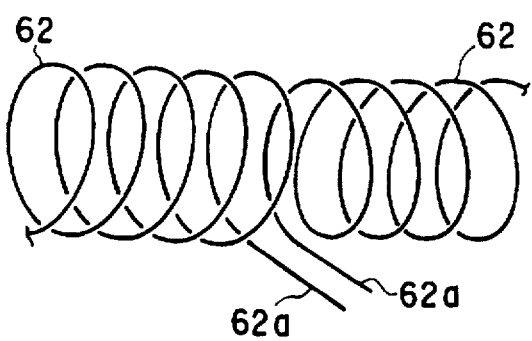
FIG. 19 is a perspective view showing another heater element dismantled.

It is preferable that plural grooves 54g are formed in the inner face of the heater block 28 and that the element 62 is made continuous as a line through these grooves 54g, as shown in FIG. 18. It is also preferable that line ends 62a are pulled out from coil-shaped elements 62 in the tangential direction, as shown in FIG. 19. When the element 62 has this line end 62a, it cannot be easily broken because it is not bent at any point.

Figure 20:
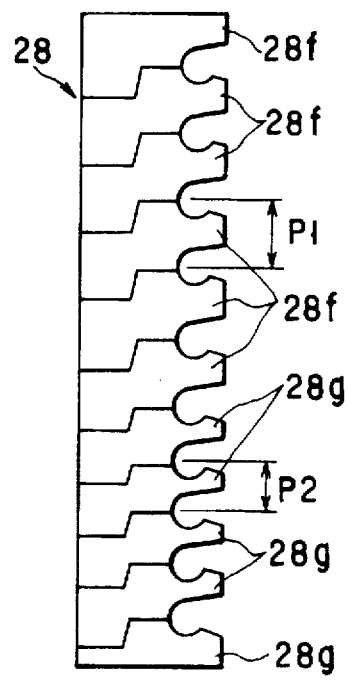
FIG. 20 is a vertically-sectioned view showing a heater holder.

It is also preferable that each heat resistant member 28f is made different in height from each heat resistant member 28g to make the pitch interval P2 of the lower portion of the heater element 62 smaller than that $P_1$ of the upper portion thereof, as shown in FIG. 20. When arranged in this manner, the quantity of heat generated at the lower zone is made larger than that at the upper zone, so that the whole of the process tube can be uniformly heated.

Figure 21:
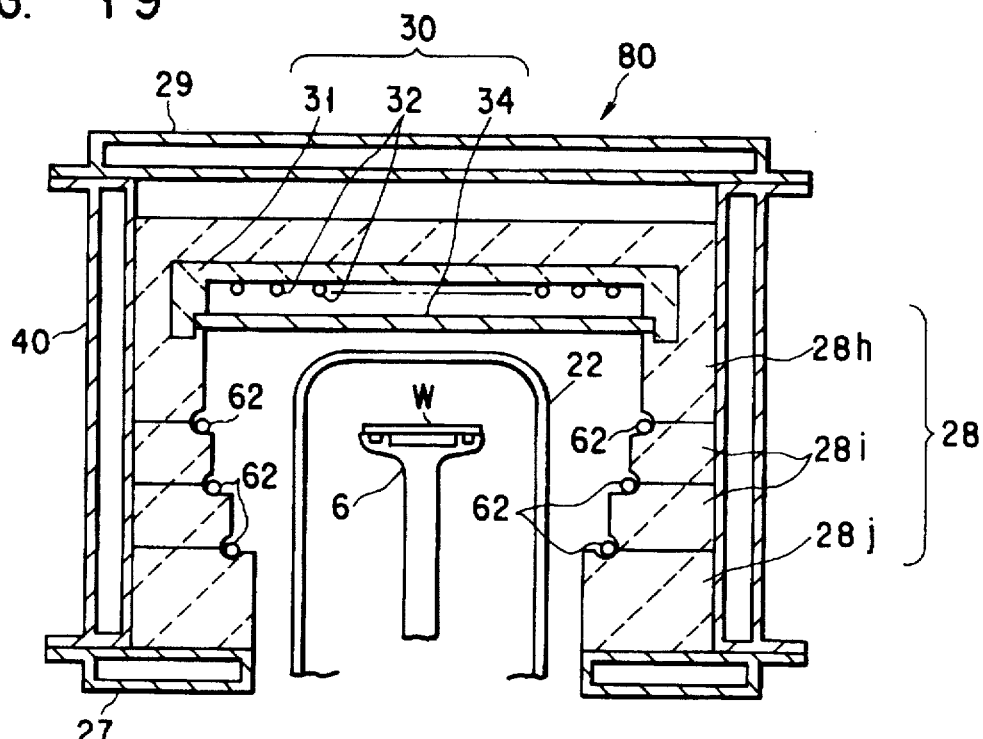
FIG. 21 is a vertically-sectioned view showing a variation of the third heat treatment apparatus.

Members 28h, 28i and 28j having different diameters may be combined with one another to form the heater block 28, as shown in FIG. 21. The top member 28h has an inner diameter larger than those of the middle members 28h and the lower one of the middle members 28i has an inner diameter larger than that of the bottom member 28j. In other words, the lower portion of the heater element 62 comes nearer to the process tube 22 than the upper portion thereof. When the heater element 62 is arranged in this manner, temperature raising speed relative to the lower portion of the process tube 22 can be made higher.

According to the above-described embodiment, it is not necessary to exchange the whole heat treatment apparatus of the vertical type with a new one even in a case where temperature distribution in the apparatus is changed in the longitudinal direction thereof. Unnecessary parts may be exchanged, in this case, with those which are needed to attain it.

Figure 22:
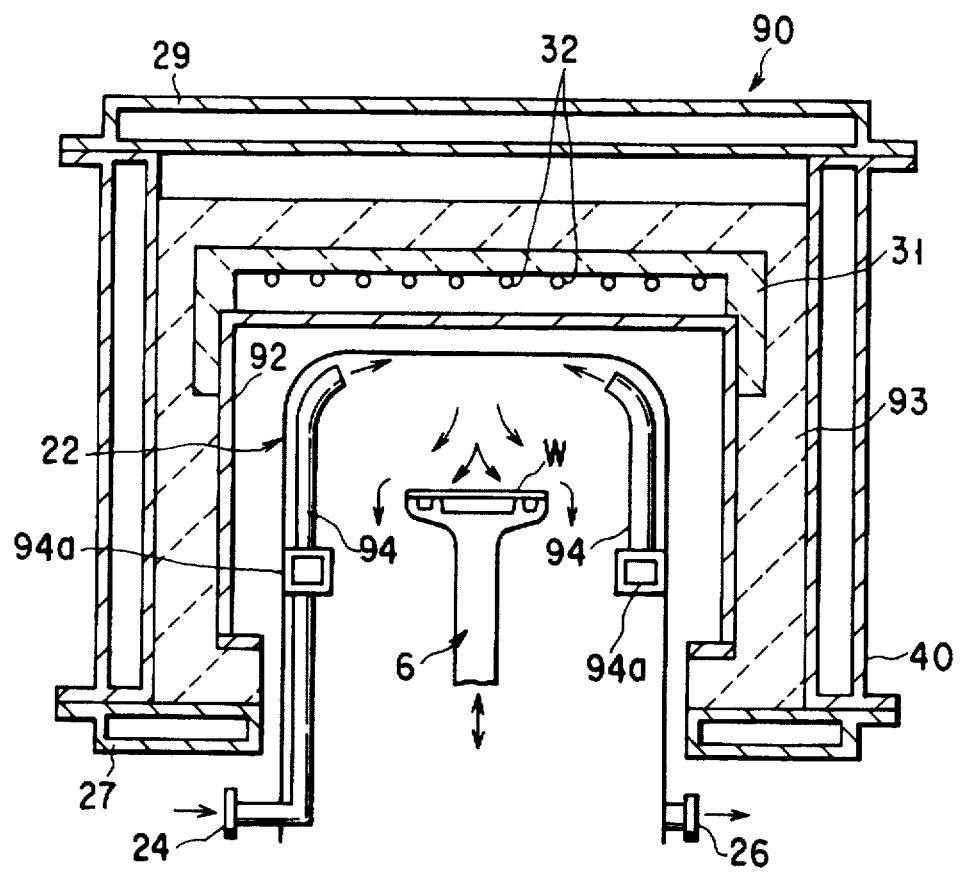
FIG. 22 is a vertically-sectioned view showing a comparison example.

In a heat treatment apparatus 90 shown in FIG. 22, process gas is supplied from above to the wafer W to act on the top of the wafer W. When the wafer W is moved at high speed and its temperature is raised and lowered also at high speed in this case, film thickness is made non-uniform in its plane. The reason is supposed to be as follows.

Figure 23:
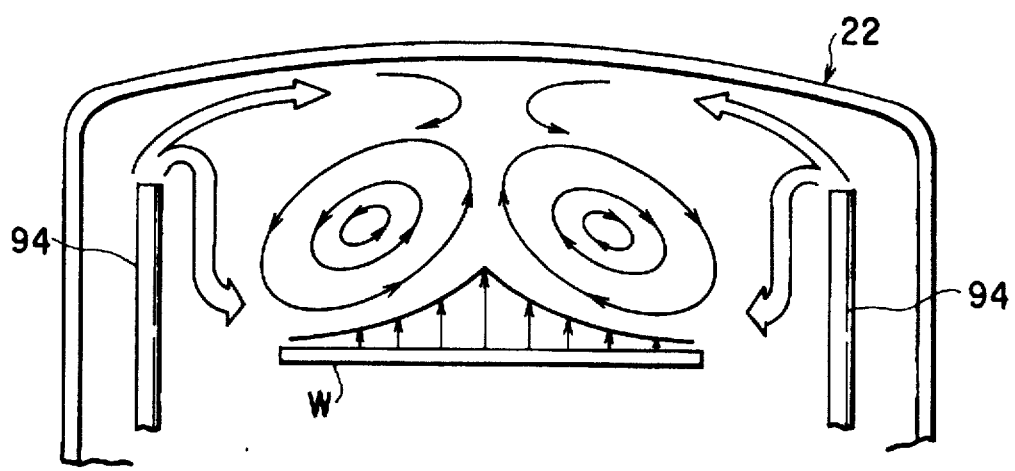
FIG. 23 is a view showing the flow of process gas in a process tube of the comparison example.

When the wafer W in the process tube 22 is heated, temperature at the center portion of the wafer W usually becomes higher than that at the peripheral portion thereof. This is because the amount of heat radiated from the peripheral portion of the wafer W is larger than that from the center portion thereof. When the wafer W is moved at high speed in the process tube 22 which is under high temperature atmosphere, rapid temperature rise is caused at the wafer center portion. As shown in FIG. 23, therefore, ascending current is likely to appear in process gas which stays around the wafer center portion. This ascending current causes convection in process gas staying near the top of the wafer W. The density of process gas staying near the wafer center portion is thus lowered. As the result, the wafer center portion cannot have a predetermined film thickness.

Figure 26:
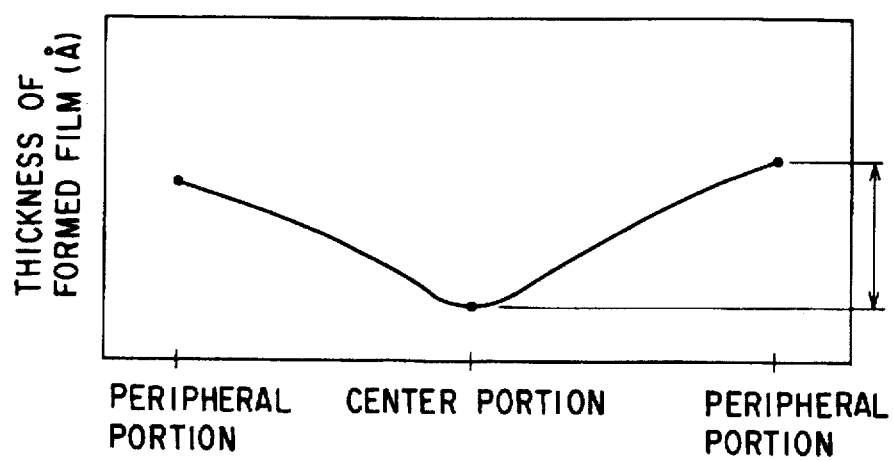
FIG. 26 is a graph showing a film thickness distribution obtained when film is heat-treated by the comparison example.

FIG. 26 is a film thickness distribution graph showing film thicknesses obtained under the following conditions. A 6-inch semiconductor wafer was used as the matter to be treated. The flow rate of process gas into the process tube was 10 SLM. Temperature in the process tube 22 was set 1000° C. and the speed of the wafer W moved in the process tube 22 was 100 mm/second. As apparent from FIG. 26, film thickness at the wafer center portion had a difference of about 5Å from that at the peripheral portions of the wafer W. Temperature difference between the center portion and the peripheral portion of the wafer W is about 0.5°–1.0° C. and it is in the allowable error range of the thermo-couple used in the heat treatment apparatus of this type. Even when temperature distribution is made substantially uniform like this in the plane of the wafer W, film thickness becomes quite different depending upon where film is formed in the plane of the wafer W. When the object to be treated is moved at high speed and its temperature is raised and lowered also at high speed, therefore, a heat treatment apparatus capable of causing the object to have a desired uniform film thickness in its plane is still needed.

Figure 24:
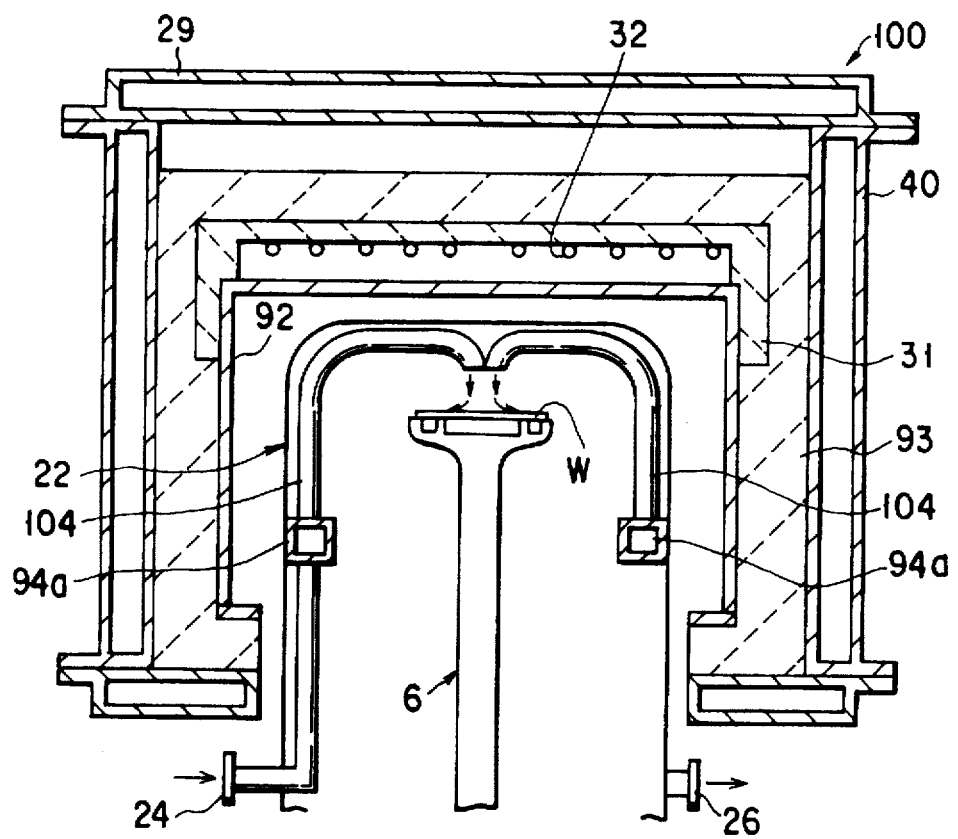
FIG. 24 is a vertically-sectioned view showing the main portion of the heat treatment apparatus according to a fourth embodiment of the present invention.

A heat treatment apparatus 100 shown in FIG. 24 has a process gas supply pipe 104. The pipe 104 branches plural in the process tube 22. Openings of these branches are positioned just above the center portion of the wafer W. Although the branches of the pipe 104 are arranged between a uniformly-heating member 92 and the wafer W, the wafer W can be uniformly heated when it is rotated. A flow rate adjuster 94a is attached to each branch of the pipe 104.

The flow rate of process gas flowing to the wafer center portion in the process tube 22 is set more than 100 mm/second. This flow rate equals to that of gas reaching the center surface of the wafer W after being injected through the branches of the pipe 104. This gas injection serves to cancel the above-mentioned ascending current.

Gas flow rate V can be obtained from an equation (3).

$$V=Q/S \cdot (T1/T2) \qquad (3)$$

wherein Q represents the amount of process gas vertically supplied to the wafer W, S the sectional area through which process gas is supplied, T1 treatment temperature, T2 the initial temperature of gas before it is supplied, and T1/T2 the expansion rate of gas.

Figure 27:
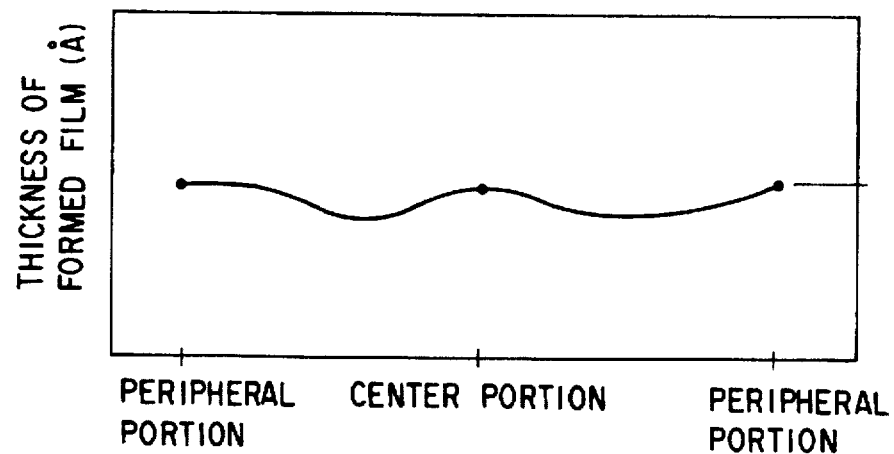
FIG. 27 is a graph showing a film thickness distribution obtained when film is heat-treated by the heat treatment apparatus of the present invention.

FIG. 27 is a film thickness distribution graph obtained when film is formed on the wafer W under the following conditions. Q=20 SLM, S=125.6(cm$^2$) (inner diameter=40 cm), T1=1000° C. (absolute temperature=1273° F.), and T2=20° C. (absolute temperature=293° F.). When the flow rate V of process gas is calculated on the basis of these values, it becomes about 10.6 mm/second. Difference of film thicknesses at the center and rim portions of the was about 1–2 Å.

Figure 28:
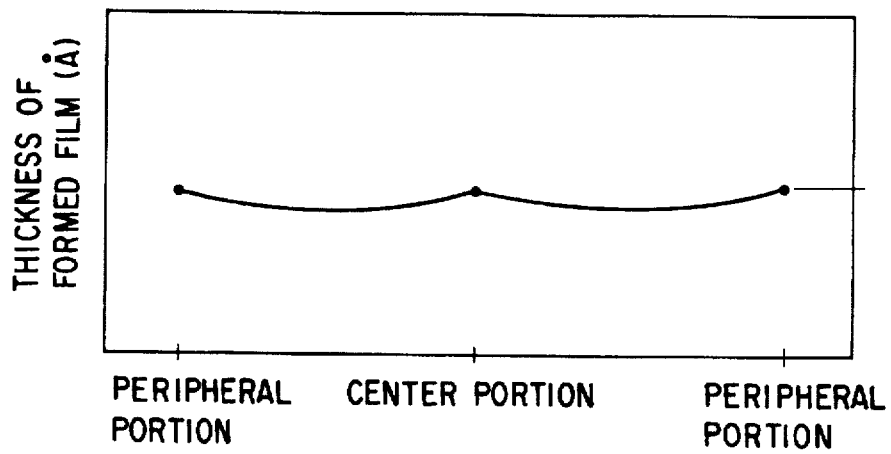
FIG. 28 is a graph showing a film thickness distribution obtained when film is heat-treated by the heat treatment apparatus of the present invention.

FIG. 28 is a film thickness distribution graph obtained when film is formed on the wafer under the following conditions. Q=24 SLM, but sectional area S and temperatures T1, T2 are same as in FIG. 27. The flow rate V becomes about 12.7 mm/second in this case.

FIGS. 27 and 28 shows that irregularity in film thickness in the plane of the wafer W can be made less when the flow rate is made higher. In short, film thickness difference shown in FIG. 28 is smaller than 1–2 Å that shown in FIG. 27.

According to the above-described embodiment shown in FIG. 24, process gas convection can be canceled and the density of process gas contacting the center portion of the wafer W is not lowered accordingly. Film thickness in the plane of the wafer W can be thus made uniform.

Figure 25:
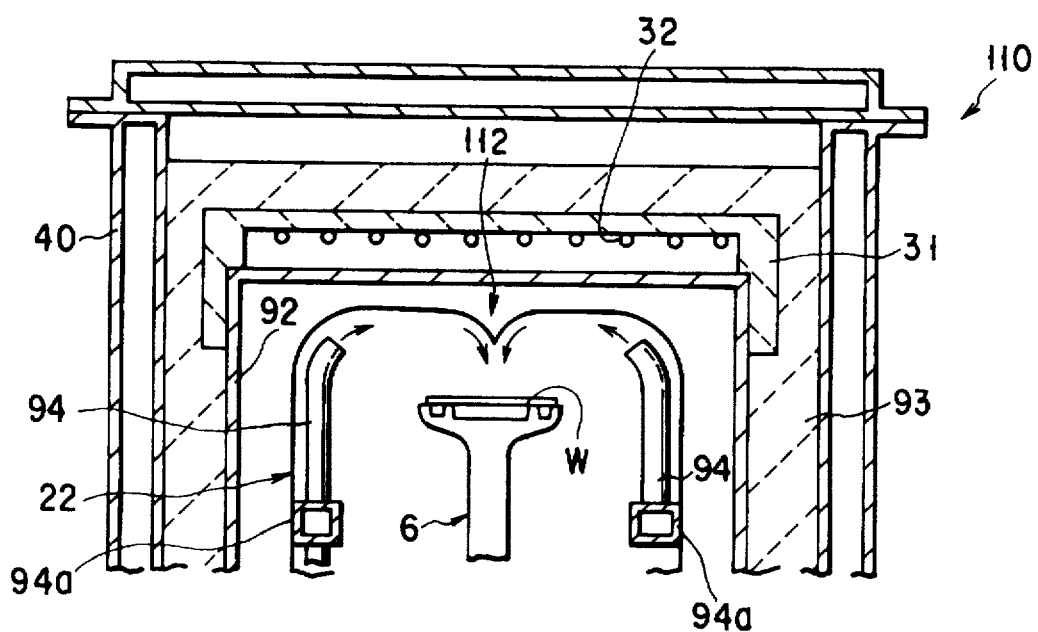
FIG. 25 is a vertically-sectioned view showing the main portion of the heat treatment apparatus according to a fifth embodiment of the present invention.

As seen in a heat treatment apparatus 110 shown in FIG. 25, a guide section 112 may be formed in the center of the top of the process tube 22. It is projected to the wafer W not to cause any turbulent flow of process gas in the process tube 22. Gas is blown from below to above through pipes 94.

Figure 29:
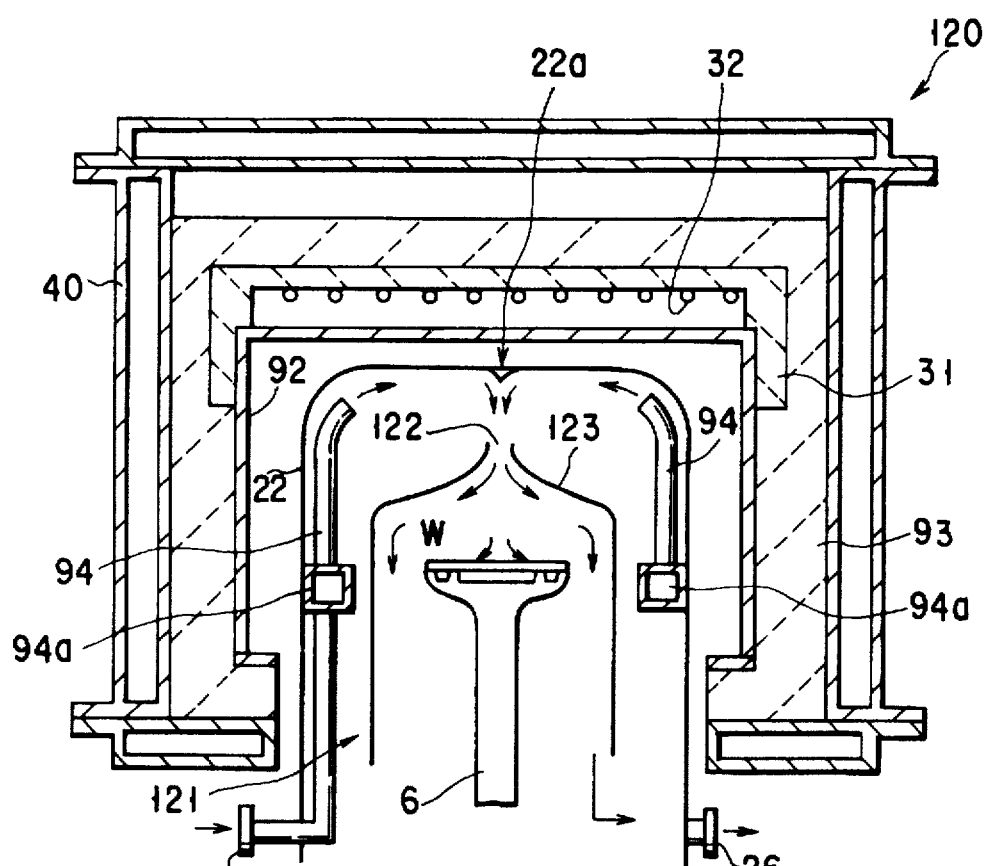
FIG. 29 is a vertically-sectioned view showing the main portion of the heat treatment apparatus according to a sixth embodiment of the present invention.

As shown in FIG. 29, it may be arranged that an inner tube 121 is housed in the process tube 22 and that process gas is introduced into the inner tube 121 through a top opening 122. The inner tube 121 is made of high purity quartz. It may also be arranged that a projection 22a is formed just above the top opening 122 and that gas is guided by the projection 22a as seen in FIG. 25. To add more, the wafer W is carried into the inner tube 121 and the open bottom of the inner tube 122 is positioned higher than the exhaust opening 26 of the outer or process tube 22.

The inner tube 121 has a curved or tilted shoulder portion 123, which serves not to rapidly change the flow of gas introduced through the top opening 122.

Gas introduced into the inner tube 121 is straightened by the shoulder portion 123 of the inner tube 121. Gas is thus allowed to flow to the center portion of the wafer W without causing any eddy and turbulence. Ascending current from the wafer side can be canceled by this straightening of gas. Therefore, the occurrence of convection in the center portion of the wafer can be prevented. Process gas is exhausted outside from the open bottom of the inner tube 121 through the exhaust opening 26.

Figure 30:
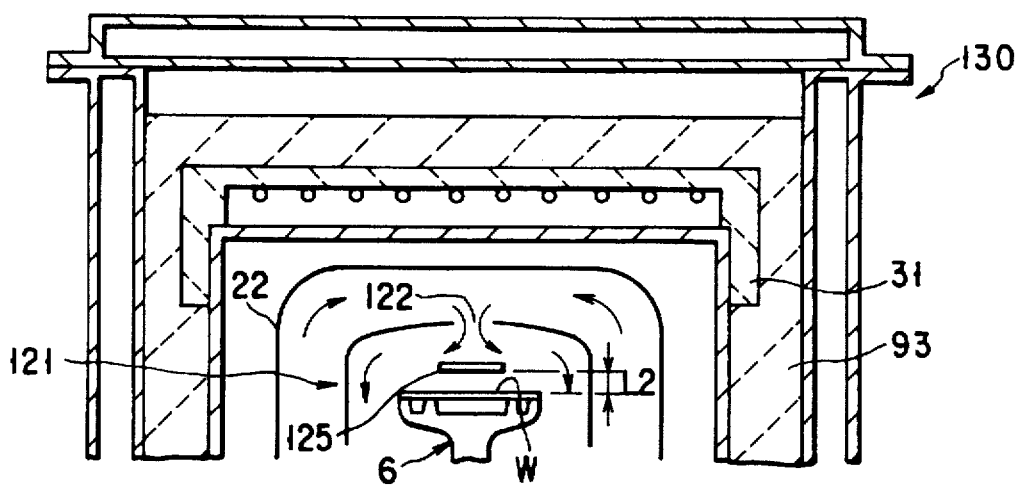
FIG. 30 is a vertically-sectioned view showing the main portion of the heat treatment apparatus according to a seventh embodiment of the present invention.

As seen in a heat treatment apparatus 130 shown in FIG. 30, an impingement baffle 125 may be arranged just under the top opening 122 of the inner tube 121. The baffle 125 has a size enough to shield the center portion of the wafer W from the top opening 122. It is a transparent plate made of high purity quartz. Its distance $L_2$ relative to the wafer W is smaller than 20 mm, preferably smaller than 10 mm.

Ascending current generated above the wafer W can be canceled by the impingement baffle 125 to thereby prevent the convection of gas from being caused in the center portion of the wafer W. This enables the inner tube 121 to be made simpler in shape.

The baffle 125 may be made of sintered porous SiC instead of transparent quartz. When it is made of this porous material, process gas, although quite a little, is allowed to flow through it. Therefore, it serves not only to disturb the flow of process gas but also to enable straightened gas to be supplied to the wafer W. The state of gas contacting the wafer W in the plane thereof can be thus made uniform.

As seen in a heat treatment apparatus 140 shown in FIG. 31, two disturbing members 141 may be arranged round the wafer W. One of them is positioned to align with the top of the wafer W at the treatment position while the other to align with the bottom thereof.

As seen in a heat treatment apparatus 150 shown in FIG. 32, second two disturbing members 142 may be further arranged under the first ones 141. The second disturbing members 142 are positioned lower than the wafer W at the treatment position.

These first and second disturbing members 141 and 142 serve to suppress the movement of gas in the process tube 22 when the wafer W is being moved in it.

According to the present invention, film thickness in the plane of the wafer W can be made uniform when temperature distribution in the plane thereof is same.

Further, current ascending from the matter to be treated, that is, ascending current can be directly prevented by the straightening plate or member.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A heat treatment apparatus provided with a ring or spiral resistant heating unit supported by an insulator block and arranged around a process tube of the vertical type, wherein said insulator block has plural ring piece members piled upon one another, and wherein two adjacent ring piece members form a space in which a portion of said resistant heating unit is housed, and said space has an opening opposed to said process tube of the vertical type.

2. The heat treatment apparatus according to claim 1, wherein one of said ring piece members has a step on its top while the other has a projection engageable with said step.

3. The heat treatment apparatus according to claim 1, wherein one of said ring piece members is made different in height from the other to change the pitch interval of said resistant heating unit.

4. The heat treatment apparatus according to claim 1, wherein an inner diameter of the space in which an upper portion of said resistant heating unit is housed is made larger than an inner diameter of the space in which the lower portion of said resistant heating unit is housed.

* * * * *